(12) United States Patent
Yang et al.

(10) Patent No.: US 9,165,954 B2
(45) Date of Patent: Oct. 20, 2015

(54) ARRAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Jing Yang, Beijing (CN); Jianshe Xue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/104,318

(22) Filed: Dec. 12, 2013

(65) Prior Publication Data

US 2014/0167035 A1     Jun. 19, 2014

(30) Foreign Application Priority Data

Dec. 14, 2012   (CN) .......................... 2012 1 0544886

(51) Int. Cl.
*H01L 29/10*      (2006.01)
*H01L 27/12*      (2006.01)
*H01L 29/66*      (2006.01)
*H01L 29/786*     (2006.01)

(52) U.S. Cl.
CPC .......... *H01L 27/127* (2013.01); *H01L 27/1225* (2013.01); *H01L 27/1288* (2013.01); *H01L 29/66969* (2013.01); *H01L 29/7869* (2013.01); *H01L 29/78693* (2013.01)

(58) Field of Classification Search
CPC ............................ H01L 29/7869; H01L 21/16
USPC .............................................. 257/43; 438/34
See application file for complete search history.

(56) References Cited

U.S. PATENT DOCUMENTS 5,777,703 A * 7/1998 Nishikawa ...................... 349/47
2004/0105041 A1* 6/2004 Tsujimura et al. .............. 349/42
(Continued)

FOREIGN PATENT DOCUMENTS

| CN | 101336485 A |   | 12/2008 |
|---|---|---|---|
| CN | 101478005 A |   | 7/2009 |
| CN | 101478005 B | * | 6/2010 |

(Continued)

OTHER PUBLICATIONS

Chinese Office Action and translation regarding Application No. 2012105448867 dated May 15, 2014. Translation provided by Dragon Intellectual Property Law Firm.

(Continued)

*Primary Examiner* — Jami M Valentine
(74) *Attorney, Agent, or Firm* — Harness, Dickey & Pierce, P.L.C.

(57) ABSTRACT

The present invention provides an array substrate and a method for manufacturing the same, and a display device. In the method for manufacturing the array substrate, a one-time patterning process is employed to form a channel region, a source electrode and a drain electrode of the array substrate. Specifically, a channel region, a source region and a drain region that are consisted of a metal oxide layer are formed via a one-time patterning process, and a heat treatment is carried out on the metal oxide layer of the source region and the drain region in hydrogen gas, thereby forming a conducting source electrode and a conducting drain electrode, respectively. By the technical solution of the invention, the manufacturing process of the array substrate can be simplified, and the manufacturing cost of the array substrate can be lowered.

7 Claims, 7 Drawing Sheets

(56) References Cited

U.S. PATENT DOCUMENTS

| | | | |
|---|---|---|---|
| 2007/0069209 A1 | 3/2007 | Jeong et al. | |
| 2010/0181563 A1* | 7/2010 | Kim et al. | 257/40 |
| 2010/0187523 A1 | 7/2010 | Sakata et al. | |

FOREIGN PATENT DOCUMENTS

| | | |
|---|---|---|
| CN | 102655155 A | 9/2012 |
| CN | 202977421 U | 6/2013 |

OTHER PUBLICATIONS

Chinese Office Action regarding Application No. 2012105448867 dated Sep. 26, 2014. Translation provided by Dragon Intellectual Property Law Firm.

Chinese Office Action dated Mar. 12, 2015 regarding Chinese Application No. 201210544886.7. Translation provided by Dragon Intellectual Property Law Firm.

* cited by examiner

ARRAY SUBSTRATE AND METHOD FOR MANUFACTURING THE SAME, AND DISPLAY DEVICE

CROSS REFERENCE

The present application claims priority to the Chinese application No. 201210544886.7 filed on Dec. 14, 2012, entitled with "An array substrate and a method for manufacturing the same, and a display device", the entire contents of which are incorporated herein by reference.

FIELD OF THE INVENTION

The present invention relates to the field of displays, and in particular, to an array substrate and a method for manufacturing the same, and a display device.

BACKGROUND OF THE INVENTION

In the prior art, it has been difficult for a hydrogenized amorphous silicon Thin Film Transistor (TFT) to meet the demands of liquid crystal TVs with an ever-increasing size and drive circuits with higher performance. Transparent amorphous oxide semiconductor TFT gains researchers' favor due to its advantages, and it develops rapidly in recent years. It has a high mobility, a good uniformity, a good transparency and a simple manufacturing process, so it may better meet the demands of large-size liquid crystal displays and Organic Light-Emitting Diode (OLED) displays. Moreover, the production line for manufacturing a transparent amorphous oxide semiconductor TFT has a good adaptability with that of the existing Liquid Crystal Display (LCD), and it is easy for product transformation, thus high-performance transparent amorphous oxide semiconductor TFT gains many attentions, and it becomes a research hotspot in the current.

However, the manufacturing process of the existing transparent amorphous oxide semiconductor TFT is complex, and the manufacturing of a bottom gate-type array substrate can only be accomplished with at least five patterning processes. Moreover, the performance stability of TFT can only be guaranteed with a multi-layer protection of an Etch stopping layer (ESL) and a passivation layer (PVX), thereby the manufacturing cost is very high.

SUMMARY OF THE INVENTION

The technical problem to be solved by the invention is to provide an array substrate and a method for manufacturing the same, and a display device, which can simplify the manufacturing process of the array substrate and lower the manufacturing cost of the array substrate.

In order to solve the above technical problem, one embodiment of the invention provides the following technical solutions:

One embodiment of the invention provides a method for manufacturing an array substrate, wherein a one-time patterning process is employed to form a channel region, a source electrode and a drain electrode of the array substrate.

Further, the method comprises:
forming a channel region, a source region and a drain region that are consisted of a metal oxide layer via a one-time patterning process; and
carrying out a heat treatment on the metal oxide layer of the source region and the drain region in hydrogen gas, and thereby forming a conducting source electrode and a conducting drain electrode, respectively.

Further, the method comprises:
forming a pixel electrode region, a channel region, a source region and a drain region that are consisted of a metal oxide layer via a one-time patterning process; and
carrying out a heat treatment on the metal oxide layer of the pixel electrode region, the source region and the drain region in hydrogen gas, and thereby forming a conducting pixel electrode, a conducting source electrode and a conducting drain electrode, respectively.

Further, the metal oxide layer is a layer which is consisted of IGZO (Indium Gallium Zinc Oxide) or ZnO.

Further, the method specifically comprises the following steps:
providing a substrate;
forming patterns of a gate electrode and a gate line that are consisted of a metal layer on the substrate via a first patterning process;
forming a gate insulating layer on the substrate subjected to the first patterning process;
forming a pattern of a pixel electrode that is consisted of a transparent conducting layer on the gate insulating layer via a second patterning process;
forming a channel region, a source region and a drain region that are consisted of a metal oxide layer on the substrate subjected to the second patterning process via a third patterning process, and carrying out a heat treatment on the metal oxide layer of the source region and the drain region in hydrogen gas, thereby forming a conducting source electrode and a drain electrode connected with the pixel electrode, respectively; and
forming, via a forth patterning process, a passivation layer on the substrate on which the source electrode and the drain electrode are formed, and forming a via hole on the passivation layer so as to lead out the source electrode and the drain electrode.

Further, the step of forming a channel region, a source region and a drain region that are consisted of a metal oxide layer on the substrate subjected to the second patterning process via a third patterning process, and carrying out a heat treatment on the metal oxide layer of the source region and the drain region in hydrogen gas, thereby forming a conducting source electrode and a drain electrode connected with the pixel electrode respectively comprises:
depositing an IGZO layer and a protection layer in sequence on the substrate subjected to the second patterning process;
forming a channel region, a source region, a drain region, and a protection layer on the channel region via a third patterning process; and
carrying out a heat treatment on an exposed IGZO layer of the source region and the drain region in hydrogen gas at 250-400° C. for 1-2 hours, thereby forming a conducting source electrode and a conducting drain electrode, respectively.

Further, the method specifically comprises the following steps:
providing a substrate;
forming patterns of a gate electrode and a gate line that are consisted of a metal layer on the substrate via a first patterning process;
forming a gate insulating layer on the substrate subjected to the first patterning process;
forming a pixel electrode region, a channel region, a source region and a drain region that are consisted of a metal oxide layer on the gate insulating layer via a second patterning process, and carrying out a heat treatment on the metal oxide layer of the pixel electrode region, the source region and the drain region in hydrogen gas, thereby forming a conducting pixel electrode, a conducting source electrode and a drain electrode connected with the pixel electrode, respectively; and forming, via a third patterning process, a passivation layer on the substrate on which the source electrode and the drain electrode are formed, and forming a via hole on the passivation layer so as to lead out the source electrode and the drain electrode.

One embodiment of the invention further provides an array substrate manufactured by the above method, wherein the channel region, the source electrode and the drain electrode of the array substrate are formed via a one-time patterning process.

Further, the pixel electrode, the channel region, the source electrode and the drain electrode of the array substrate are formed via a one-time patterning process.

Further, the channel region, the source electrode and the drain electrode are formed from a metal oxide.

Further, the pixel electrode, the channel region, the source electrode and the drain electrode are formed of a metal oxide.

Further, the metal oxide is IGZO or ZnO.

Further, the array substrate comprises:

a gate electrode and a gate line on the substrate;

a gate insulating layer on the substrate on which the gate electrode and the gate line are formed;

a pixel electrode on the gate insulating layer;

a channel region, a source electrode, and a drain electrode connected with the pixel electrode that are located on the substrate on which the pixel electrode is formed; and a passivation layer on the substrate on which the channel region, the source electrode and the drain electrode are formed, wherein the passivation layer includes a via hole for leading out the source electrode and the drain electrode.

Further, the array substrate comprises:

a gate electrode and a gate line on the substrate;

a gate insulating layer on the substrate on which the gate electrode and the gate line are formed;

a pixel electrode, a channel region, a source electrode and a drain electrode connected with the pixel electrode that are located on the gate insulating layer; and a passivation layer on the substrate on which the channel region, the source electrode and the drain electrode are formed.

One embodiment of the invention further provides a display device, which comprises the above array substrate.

The embodiments of the invention have the following advantageous technical effects:

In the above solutions, the channel region, the source electrode and the drain electrode of the array substrate are formed via a one-time patterning process, and no extra patterning processes need to be employed to manufacture the source electrode and the drain electrode, thereby the production processes of the array substrate may be simplified. Specifically, the exposing processes and the deposition of metal layers can be reduced, the manufacturing time of the array substrate may be greatly shortened, and the production cost of the array substrate may be lowered.

REFERENCE LABEL

1 Substrate
2 Gate Electrode
3 Gate Insulating Layer
4 Source Electrode
5 Drain Electrode
6 Active Layer
7 Transparent Conducting Layer
8 Electrode Lead
9 Protection Layer
10 Passivation Layer
11 Gate Line
12 Data Line

DETAILED DESCRIPTION OF THE PREFERRED EMBODIMENTS

In order to make the technical problem to be solved, the technical solutions and the advantages of the embodiments of the invention more apparent, descriptions will be given below in conjunction with the drawings and the specific embodiments.

For the problems of the prior art that the manufacturing process of a transparent amorphous oxide semiconductor TFT is complex, the manufacturing of a bottom gate-type array substrate can only be accomplished with at least five patterning processes, the performance stability of a TFT can only be guaranteed with a multi-layer protection of an ESL and an PVX and the manufacturing cost is very high, the embodiments of the invention provide an array substrate and a method for manufacturing the same, and a display device, which can simplify the manufacturing process of the array substrate and lower the manufacturing cost of the array substrate.

One embodiment of the invention provides a method for manufacturing an array substrate, wherein a channel region, a source electrode and a drain electrode of the array substrate are formed via a one-time patterning process.

The channel region, the source electrode and the drain electrode of the array substrate are formed via a one-time patterning process, thus no extra patterning processes need to be employed to manufacture the source electrode and the drain electrode, thereby the production processes of the array substrate may be simplified, the exposing processes and the deposition of metal layers may be reduced, the manufacturing time of the array substrate may be greatly shortened, and the production cost of the array substrate may be lowered.

According to the embodiment of the invention, the same metal oxide material is employed to form the channel region, the source electrode and the drain electrode of the array substrate, and then after a treatment is carried out on the metal oxide corresponding to the source electrode and the drain electrode, the source electrode and the drain electrode are made to have a conductivity. Specifically, the channel region, the source electrode and the drain electrode of the array substrate can all be formed from IGZO or ZnO.

Wherein, when IGZO is employed to form the channel region, the source electrode and the drain electrode, a channel region, a source region and a drain region that are consisted of a IGZO layer are first formed via a one-time patterning process, and then a heat treatment is carried out on the IGZO layer of the source region and the drain region in hydrogen gas, thereby a conducting source electrode and a conducting drain electrode are formed respectively. Specifically, a heat treatment may be carried out on the IGZO layer of the source region and the drain region in a hydrogen gas atmosphere at a high temperature of 250-400° C. for 1-2 hours, so as to form a conducting source electrode and a conducting drain electrode, respectively.

Further, in the embodiment of the invention, said one patterning process may also be employed to form a pixel electrode region, a channel region, a source region and a drain region that are consisted of a metal oxide layer, and a heat treatment may be carried out on the metal oxide layer of the pixel electrode region, the source region and the drain region in hydrogen gas, thereby forming a conducting pixel electrode, a conducting source electrode and a conducting drain electrode, respectively. At this point, the method for manufacturing an array substrate specifically include the following steps:

providing a substrate;

forming patterns of a gate electrode and a gate line that are consisted of a metal layer on the substrate via a first patterning process;

forming a gate insulating layer on the substrate subjected to the first patterning process;

forming a pixel electrode region, a channel region, a source region and a drain region that are consisted of a metal oxide layer on the gate insulating layer via a second patterning process, and carrying out a heat treatment on the metal oxide layer of the pixel electrode region, the source region and the drain region in hydrogen gas, thereby forming a conducting pixel electrode, a conducting source electrode and a drain electrode connected with the pixel electrode, respectively; and forming, via a third patterning process, a passivation layer on the substrate on which the source electrode and the drain electrode are formed, and forming a via hole on the passivation layer so as to lead out the source electrode and the drain electrode.

In this embodiment, the production process of the array substrate may be further simplified, and the manufacturing of an array substrate may be accomplished via only three patterning processes.

One embodiment of the invention further provides an array substrate manufactured by the above method, wherein a channel region, a source electrode and a drain electrode of the array substrate are formed via a one-time patterning process.

Specifically, the channel region, the source electrode and the drain electrode of the array substrate are formed from a metal oxide. The metal oxide is IGZO or ZnO, when the channel region, the source electrode and the drain electrode are formed by employing IGZO, the source electrode and the drain electrode will be formed after the IGZO is subjected to the heat treatment in hydrogen gas at 250-400° C. for 1-2 hours.

Further, in another embodiment, the pixel electrode, the channel region, the source electrode and the drain electrode of the array substrate may also be formed via a one-time patterning process. Specifically, the pixel electrode, the channel region, the source electrode and the drain electrode of the array substrate are formed from a metal oxide. The metal oxide is IGZO or ZnO, and when the pixel electrode, the channel region, the source electrode and the drain electrode are formed by employing IGZO, the pixel electrode, the source electrode and the drain electrode will be formed after the IGZO is subjected to the heat treatment in hydrogen gas at 250-400° C. for 1-2 hours.

Further, the array substrate includes:

a gate electrode and a gate line on the substrate;

a gate insulating layer on the substrate on which the gate electrode and the gate line are formed;

a pixel electrode on the gate insulating layer;

a channel region, a source electrode, and a drain electrode connected with the pixel electrode that are located on the substrate on which the pixel electrode is formed; and a passivation layer on the substrate on which the channel region, the source electrode and the drain electrode are formed, wherein the passivation layer includes a via hole for leading out the source electrode and the drain electrode.

Further, the array substrate includes:

a gate electrode and a gate line on the substrate;

a gate insulating layer on the substrate on which the gate electrode and the gate line are formed;

a pixel electrode, a channel region, a source electrode and a drain electrode connected with the pixel electrode that are located on the gate insulating layer; and a passivation layer on the substrate on which the channel region, the source electrode and the drain electrode are formed.

An array substrate according to the invention and a method for manufacturing the same will be further described below in conjunction with the specific embodiments by taking the situation in which the channel region, the source electrode and the drain electrode are formed from IGZO as an example.

Figure 1:
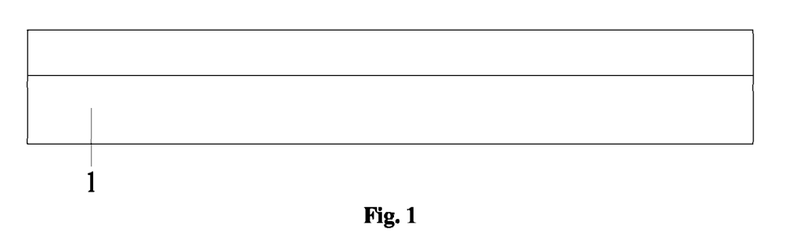
FIG. 1 is a schematic sectional view of the array substrate after a metal layer is deposited on a substrate according to one embodiment of the invention.
Figure 2:
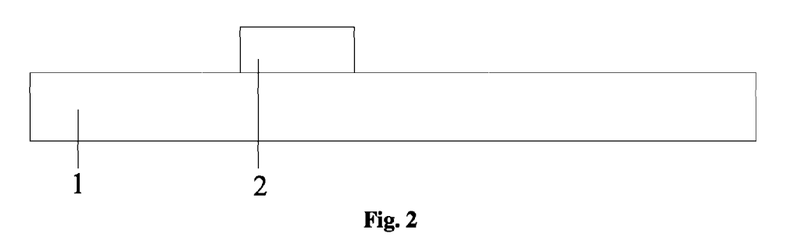
FIG. 2 is a schematic sectional view of the array substrate after the first patterning process according to one embodiment of the invention.

As shown in FIGS. 1-9, the method for manufacturing an array substrate according to this embodiment includes the following steps:

Step 1: providing a substrate, and forming patterns of a gate electrode and a gate line that are consisted of a metal layer on the substrate via a first patterning process.

Specifically, the substrate may be a transparent substrate. As shown in FIG. 1 and FIG. 2, a metal is deposited on the substrate 1, and a gate electrode 2 and a gate line are formed via a first patterning process.

Specifically, a metal layer with a thickness of from about 200 nm to about 400 nm may be deposited on the substrate 1 via magnetron sputtering, wherein the metal layer may employ any one of Nd, Cr, W, Ti, Ta, Mo, Al and Cu, or an alloy of at least two thereof. Then after a photoresist is coated on the metal layer, the photoresist is exposed via a mask slice, developed and etched to form patterns of the gate electrode 2 and the gate line.

Figure 3:
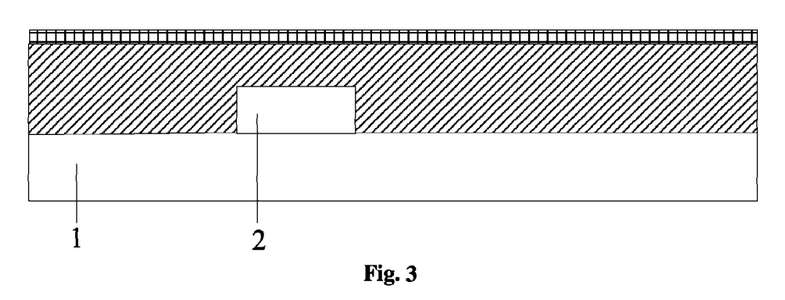
FIG. 3 is a schematic sectional view of the array substrate after a gate insulating layer and a transparent conducting layer are deposited according to one embodiment of the invention.
Figure 4:
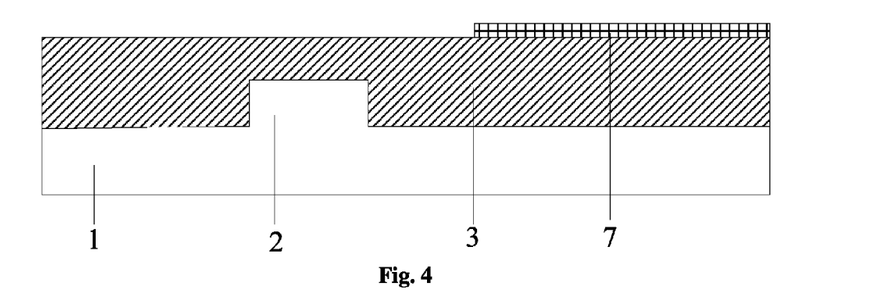
FIG. 4 is a schematic sectional view of the array substrate after the second patterning process according to one embodiment of the invention.

Step 2: forming a gate insulating layer on the substrate subjected to the first patterning process, and forming a pattern of a pixel electrode consisted of a transparent conducting layer on the gate insulating layer via a second patterning process;

As shown in FIG. 3 and FIG. 4, a gate insulating layer 3 and a transparent conducting layer are continuously deposited on the substrate 1 on which Step 1 has been accomplished. Specifically, the gate insulating layer may employ $SiN_x$, $SiO_2$, $Al_2O_3$, AlN or resin, and the transparent conducting layer may employ ITO (Indium Tin Oxide), and then a pixel electrode 7 is formed on the gate insulating layer 3 via a second patterning process.

Specifically, a layer of $Al_2O_3$ or AN with a thickness of 400 nm may be deposited via magnetron sputtering on the substrate 1 on which Step 1 has been accomplished, or a layer of $SiN_x$ with a thickness of 400 nm may be deposited via Plasma Enhanced Chemical Vapor Deposition (PECVD) on the substrate 1 on which Step 1 has been accomplished, and then an ITO layer with a thickness of 40 nm may be deposited via magnetron sputtering. A photoresist is coated on the ITO layer, and then the photoresist is exposed via a mask slice, developed and etched to form a pattern of pixel electrode 7.

Figure 5:
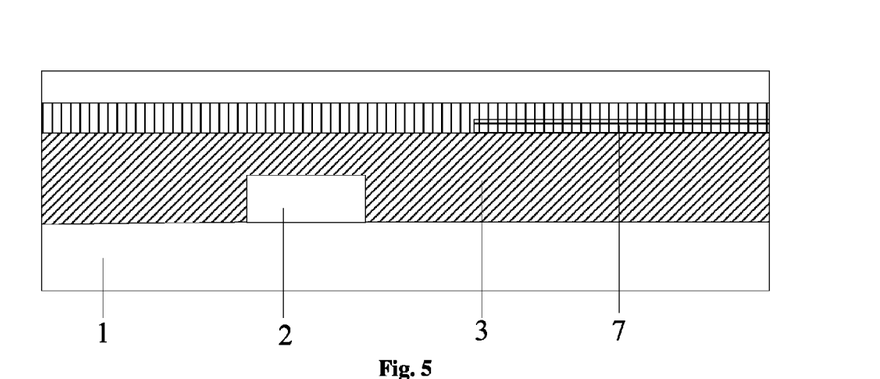
FIG. 5 is a schematic plan view of the array substrate after an IGZO layer and a protection layer are deposited according to one embodiment of the invention.
Figure 6:
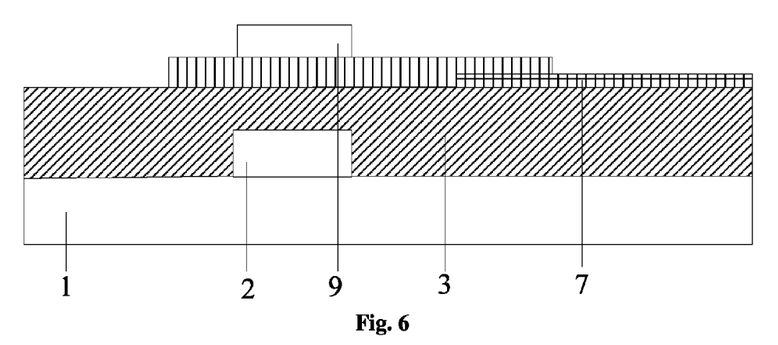
FIG. 6 is a schematic sectional view of the array substrate after the third patterning process according to one embodiment of the invention.
Figure 7:
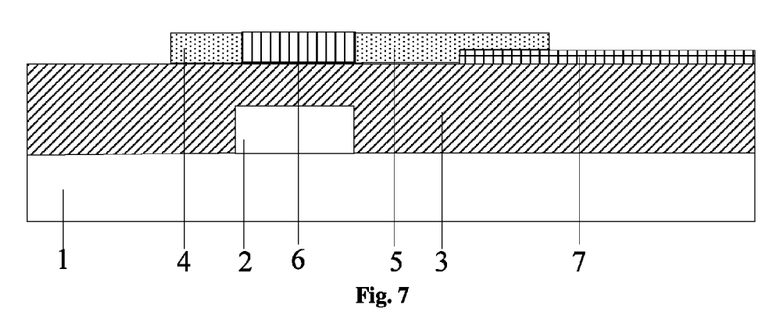
FIG. 7 is a schematic sectional view of the array substrate after a treatment is carried out on the IGZO of the drain region and the source region and the protection layer on the channel region is etched off according to one embodiment of the invention.

Step 3: forming a channel region, a source region and a drain region that are consisted of a IGZO layer, via a third patterning process, on the substrate subjected to the second patterning process, and carrying out a heat treatment on the IGZO layer of the source region and the drain region in hydrogen gas, thereby forming a conducting source electrode and a conducting drain electrode, respectively;

As shown in FIG. 5, FIG. 6 and FIG. 7, an IGZO layer and a protection layer are deposited on the substrate 1 on which Step 2 has been accomplished, and a channel region 6, a source region and a drain region are formed via a third patterning process, wherein, the protection layer 9 is located above the channel region 6, and a heat treatment is carried out on the exposed IGZO in hydrogen gas, so that it becomes a conductive source electrode 4 and a conductive drain electrode 5, and the drain electrode 5 is connected with the pixel electrode 7.

IGZO may be taken as the material of the active layer, and IGZO can be made conductive after a heat treatment is carried out thereon in hydrogen gas. In this embodiment, this feature of IGZO is utilized, and the channel region, the source region and the drain region are formed simultaneously via a one-time patterning process, and then a treatment is carried out on the IGZO of the source region and the drain region so as to make them a source electrode and a drain electrode respectively, thereby a patterning process for manufacturing the source electrode and the drain electrode may be reduced.

Specifically, an amorphous oxide thin film IGZO with a thickness of 50 nm may be deposited as an active layer via magnetron sputtering on the substrate 1 on which Step 2 has been accomplished. Then a $SiN_x$ layer with a thickness of 500 nm may be deposited via PECVD as the protection layer 9, a photoresist may be coated on the protection layer 9, and the photoresist may be exposed via a mask slice, developed and etched to form a structure as shown in FIG. 6, wherein a protection layer 9 is left on the channel region 6, and the source region and the drain region are exposed, and a heat treatment is carried out on the exposed source region and drain region in a hydrogen gas atmosphere at a high temperature of 250-400° C. for 1-2 hours, so that the exposed source region and drain region become a conductive source electrode 4 and a conductive drain electrode 5 respectively. Then the protection layer 9 is etched off to form a structure as shown in FIG. 7.

Figure 8:
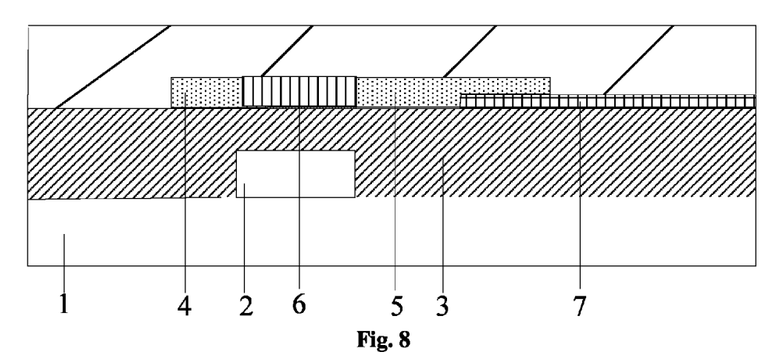
FIG. 8 is a schematic plan view of the array substrate after a passivation layer is deposited according to one embodiment of the invention.
Figure 9:
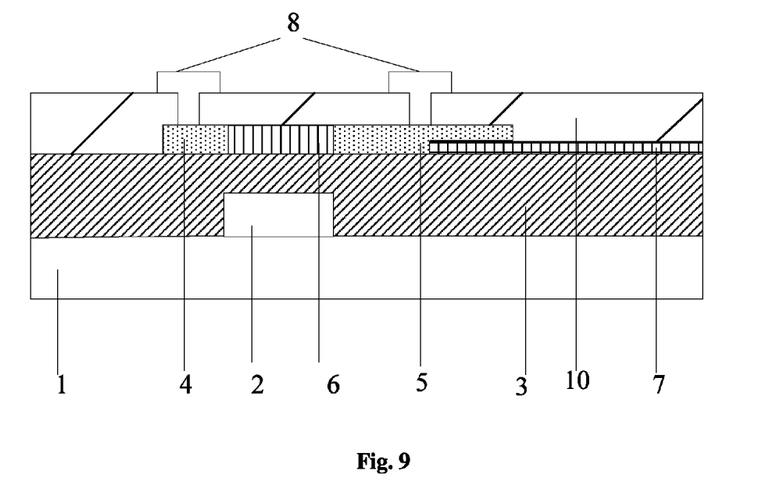
FIG. 9 is a schematic sectional view of the array substrate after the forth patterning process according to one embodiment of the invention.

Step 4: forming a pattern of a passivation layer on the substrate on which the source electrode and the drain electrode are formed via a forth patterning process.

As shown in FIG. 8 and FIG. 9, a passivation layer is deposited on the substrate 1 on which Step 3 has been accomplished, a pattern of a passivation layer 10 with a via hole is formed via a forth patterning process, and a source electrode 4 and a drain electrode 5 are respectively connected with an electrode lead 8 by the via hole. The electrode lead 8 is connected with a peripheral drive circuit for providing a data signal to the source electrode. Specifically, the passivation layer 10 may employ $SiO_2$ or $SiN_x$.

Specifically, a passivation layer 10 with a thickness of 200 nm~400 nm may be deposited via PECVD on the substrate 1 on which Step 3 has been accomplished, a layer of photoresist may be coated on the passivation layer 10, and the photoresist may be exposed via a mask slice, developed and etched to form a structure as shown in FIG. 9, and an electrode lead 8 may be employed to lead out the source electrode 4 and the drain electrode 5.

Finally, an array substrate as shown in FIG. 9 may be formed via the above Steps 1-4, which includes:

a gate electrode 2 and a gate line on a substrate 1;

a gate insulating layer 3 on the substrate 1 on which the gate electrode 2 and the gate line are formed;

a pixel electrode 7 on the gate insulating layer 3;

a channel region 6, a source electrode 4 and a drain electrode 5 on the substrate 1 on which the pixel electrode 7 is formed, wherein the drain electrode 5 is connected with the pixel electrode 7;

a passivation layer 10 with a via hole on the substrate 1 on which the channel region 6, the source electrode 4 and the drain electrode 5 are formed, wherein the source electrode 4 and the drain electrode 5 are respectively connected with an electrode lead 8 by the via hole.

In the embodiment of the invention, the channel region, the source electrode and the drain electrode of the array substrate are formed via a one-time patterning process, and totally four patterning processes are employed to prepare an amorphous oxide thin film transistor array substrate. The heat treatment is carried out on the exposed active layer IGZO in a hydrogen gas atmosphere so as to make it a conductive source electrode and a conductive drain electrode. It does not necessarily need to add the manufacturing processes of the source electrode and the drain electrode, thereby the manufacturing process of the array substrate may be simplified, the exposing processes and the deposition of metal layers may be reduced, the manufacturing time of the array substrate may be greatly shortened, and the manufacturing cost of the array substrate may be lowered.

Figure 10:
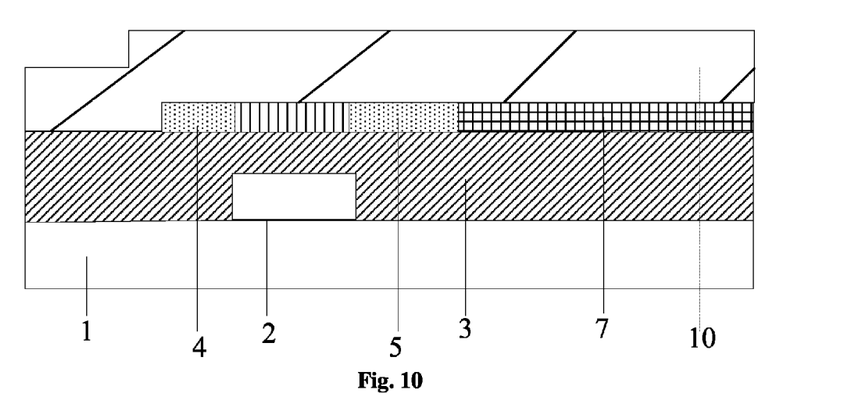
FIG. 10 is a schematic sectional view of the array substrate according to another embodiment of the invention.
Figure 11:
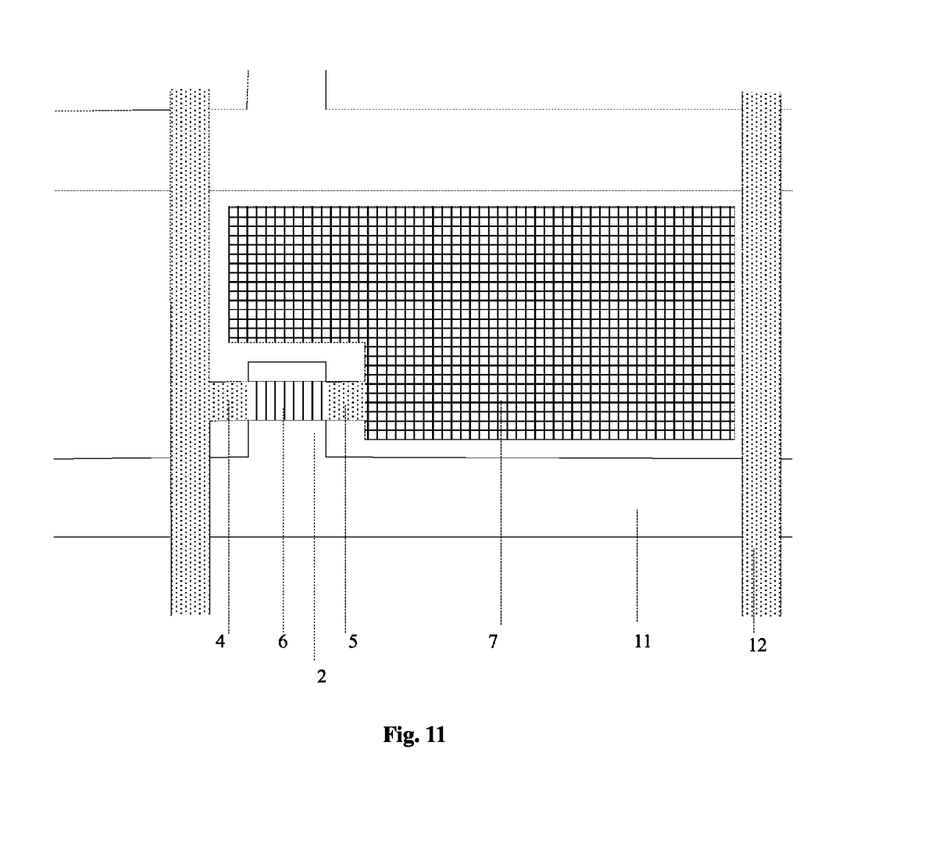
FIG. 11 is a schematic plan view of the array substrate according to another embodiment of the invention.
Figure 12:
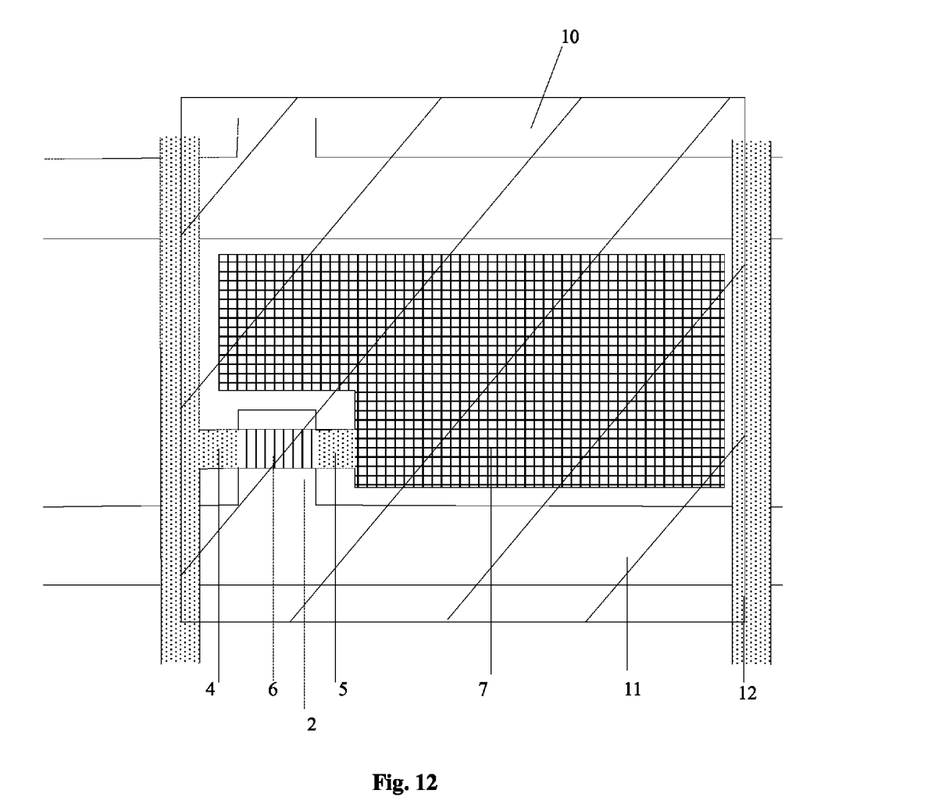
FIG. 12 is a schematic plan view of the array substrate according to a further embodiment of the invention.

Further, as shown in FIG. 10 and FIG. 11, no electrode lead will be manufactured for the array substrate according to the embodiment of the invention, and a data signal may be input from a data line led out at the edge of the array substrate. Further, as shown in FIG. 12, since the passivation layer 10 does not completely cover the data line 12, the data line 12 can transmit an external data signal without the need to set a via hole of the passivation layer.

The invention further provides a display device that includes the above array substrate. Specifically, the display device may be a liquid crystal display device, for example, a liquid crystal panel, a liquid crystal TV, a mobile phone and a liquid crystal display, etc., which includes a color film substrate and an array substrate according to the above embodiments. In addition to the liquid crystal display device, the display device may also be a display device of other types, for example, an electronic reading device, etc., which does not include a color film substrate, but includes an array substrate according to the above embodiments.

The above description only shows some embodiments of the invention, and it should be pointed out that, for one of ordinary skills in the art, many improvements and modifications can be made without departing from the principle of the invention, and all these improvements and modifications fall into the protection scope of the invention.

What is claimed is:

1. A method for manufacturing an array substrate, the method comprising:
    forming a channel region, a source region, and a drain region using a one-time patterning process, wherein the one-time patterning process includes depositing a single metal oxide layer to form the channel region, the source region, and the drain region; and
    carrying out a heat treatment on the metal oxide layer of the source region and the drain region in hydrogen gas, and thereby forming a conducting source electrode and a conducting drain electrode, respectively.

2. A method for manufacturing an array substrate, the method comprising:
    forming a pixel electrode region, a channel region, a source region, and a drain region using a one-time patterning process, wherein the one-time patterning process includes depositing a single metal oxide layer to form the pixel electrode region, the channel region, the source region, and the drain region; and
    carrying out a heat treatment on the metal oxide layer of the pixel electrode region, the source region, and the drain region in hydrogen gas, and thereby forming a conducting pixel electrode, a conducting source electrode, and a conducting drain electrode, respectively.

3. The method for manufacturing an array substrate of claim 1, wherein the metal oxide layer is a layer including IGZO or ZnO.

4. The method for manufacturing an array substrate of claim 2, wherein the metal oxide layer is a layer including IGZO or ZnO.

5. The method for manufacturing an array substrate of claim 1, wherein the method comprises:
    providing a substrate;
    forming, via a first patterning process, patterns of a gate electrode and a gate line including a metal layer on the substrate;
    forming a gate insulating layer on the substrate subjected to the first patterning process;
    forming, via a second patterning process, a pattern of a pixel electrode including a transparent conducting layer on the gate insulating layer;
    forming, by way of the one-time patterning process as a third patterning process, the channel region, the source region, and the drain region on the substrate subjected to the second patterning process and carrying out the heat treatment on the metal oxide layer of the source region and the drain region in hydrogen gas, thereby forming the conducting source electrode and the drain electrode connected with the pixel electrode, respectively; and
    forming, via a forth patterning process, a passivation layer on the substrate on which the source electrode and the drain electrode are formed, and forming a via hole on the passivation layer so as to lead out the source electrode and the drain electrode.

6. The method for manufacturing an array substrate of claim 5, wherein the step of forming the channel region, the source region, and the drain region via the third patterning process, and carrying out the heat treatment on the metal oxide layer of the source region and the drain region in hydrogen gas, thereby forming the conducting source electrode and the drain electrode connected with the pixel electrode, respectively, comprises:
    depositing an IGZO layer and a protection layer in sequence on the substrate subjected to the second patterning process;
    forming the channel region, the source region, the drain region, and a protection layer on the channel region via the third patterning process; and
    carrying out the heat treatment on an exposed IGZO layer of the source region and the drain region in hydrogen gas at 250-400° C. for 1-2 hours, thereby forming the conducting source electrode and the conducting drain electrode, respectively.

7. The method for manufacturing an array substrate of claim 2, wherein the method comprises:
    providing a substrate;
    forming, via a first patterning process, patterns of a gate electrode and a gate line including a metal layer on the substrate;
    forming a gate insulating layer on the substrate subjected to the first patterning process;
    forming, by way of the one-time patterning process as a second patterning process, the pixel electrode region, the channel region, the source region, and the drain region on the gate insulating layer, and carrying out the heat treatment on the metal oxide layer of the pixel electrode region, the source region, and the drain region in hydrogen gas, thereby forming the conducting pixel electrode, the conducting source electrode, and the drain electrode connected with the pixel electrode, respectively; and
    forming, via a third patterning process, a passivation layer on the substrate on which the source electrode and the drain electrode are formed, and forming a via hole on the passivation layer so as to lead out the source electrode and the drain electrode.

* * * * *